United States Patent
Wu et al.

[11] Patent Number: 5,952,885
[45] Date of Patent: Sep. 14, 1999

[54] CURRENT-TO-VOLTAGE CONVERTER WITH HIGHPASS FILTER FUNCTION

[75] Inventors: Chien-Ping Wu; Chang-Da Tsai; Jiann-Jong Chen, all of Taipei, Taiwan

[73] Assignee: National Science Council, Taipei, Taiwan

[21] Appl. No.: 08/964,728

[22] Filed: Nov. 5, 1997

[30] Foreign Application Priority Data

Jan. 23, 1997 [TW] Taiwan ................................ 86100744

[51] Int. Cl.[6] .................................................... H03F 1/34
[52] U.S. Cl. ............................................. 330/294; 330/85
[58] Field of Search ............................ 330/85, 107, 294, 330/306

[56] References Cited

U.S. PATENT DOCUMENTS 4,999,584  3/1991  Eskelinen ................. 330/107
5,606,277  2/1997  Feliz ........................ 330/85 X Primary Examiner—Robert Pascal
Assistant Examiner—Khanh Van Nguyen
Attorney, Agent, or Firm—Hitt Chwang & Gaines, P.C.

[57] ABSTRACT

A current-to-voltage converter with highpass filter function constructed according to the present invention contains two operational amplifiers OP1 and OP2, two resistors $R_1$ and $R_2$, and a capacitor $C_1$. The noninverting (+) terminal of the operational amplifier OP1 is grounded. The inverting (−) terminal of the operational amplifier OP1 is used to receive the output of the current-type sensing device and connected to the output terminal of the operational amplifier OP2 via the resistor $R_2$. The output terminal of the operational amplifier OP1 is connected to the noninverting terminal of the operational amplifier OP2. The output of the operational amplifier OP2 is fed back to the inverting terminal of the operational amplifier OP2 via the capacitor $C_1$, and the inverting terminal of the operational amplifier OP2 is connected to one terminal of the resistor $R_1$ of which another terminal is grounded.

1 Claim, 4 Drawing Sheets

CURRENT-TO-VOLTAGE CONVERTER WITH HIGHPASS FILTER FUNCTION

FIELD OF THE INVENTION

The present invention is related to a current-to-voltage converter which is able to remove low-frequency signal using minimum elements.

BACKGROUND OF THE INVENTION

The output signals of many sensing devices, e.g. piezoelectric accelerometer or photodetector, are current signals. The piezoelectric accelerometer is often used for the measurement of pressure signals. The photodetector is often used to convert incident light to a current. The photodetector has been widely applied in medical instrumentation, laboratory instrumentation, position and proximity sensors, photographic analyzers, barcode scanners and smoke detectors. Because the electrical techniques of processing current signals are not so popular as those of processing voltage signals, the post processing circuit of the current-type sensing device is usually a current-to-voltage converter. However, the measured signal is often corrupted with dc or low-frequency interference with large magnitude. Hence, in order to obtain a desired better suppression of unwanted interference in the applications of current-type sensing devices, a new circuit is presented in this invention for the realization of a current-to-voltage converter with highpass filter function.

In the literature, the monolithic combination of photodiode and transresistance amplifier on a single chip has been produced for the measurement and instrumentation applications by the Burr-Brown (BB) Corp. A cascode design for the photodetector with a highpass filter has been developed by the BB Corp. to reject ambient light, yet provide high ac gain for best signal-to-noise ratio. However, the photodetector with highpass filter function recommended by the BB Corp. needs six passive elements and requires the symmetric condition of passive elements. In this invention, we also propose a new circuit for photodetector to reject ambient light with the utilization of only three passive elements. The proposed circuit enjoys the advantages of the independence of −3 dB frequency and the gain, and no constraint of requiring the matched elements.

SUMMARY OF THE INVENTION

The current-to-voltage converter with highpass filter function constructed according to the present invention comprises two operational amplifiers OP1 and OP2, two resistors $R_1$ and $R_2$, and a capacitor $C_1$.

The noninverting (+) terminal of the operational amplifier OP1 is grounded. The inverting (−) terminal of the operational amplifier OP1 is used to receive the output of the current-type sensing device and connected to the output terminal of the operational amplifier OP2 via the resistor $R_2$. The output terminal of the operational amplifier OP1 is connected to the noninverting terminal of the operational amplifier OP2. The output of the operational amplifier OP2 is fed back to the inverting terminal of the operational amplifier OP2 via the capacitor $C_1$, and the inverting terminal of the operational amplifier OP2 is connected to one terminal of the resistor $R_1$ of which another terminal is grounded.

BRIEF DESCRIPTION OF THE DRAWINGS

The foregoing and other objects, aspects and advantages will be better understood from the following detailed description of the preferred embodiment of the invention with reference to the accompanying drawings and in which.

DETAILED DESCRIPTION OF THE PREFERRED EMBODIMENT

Figure 1:
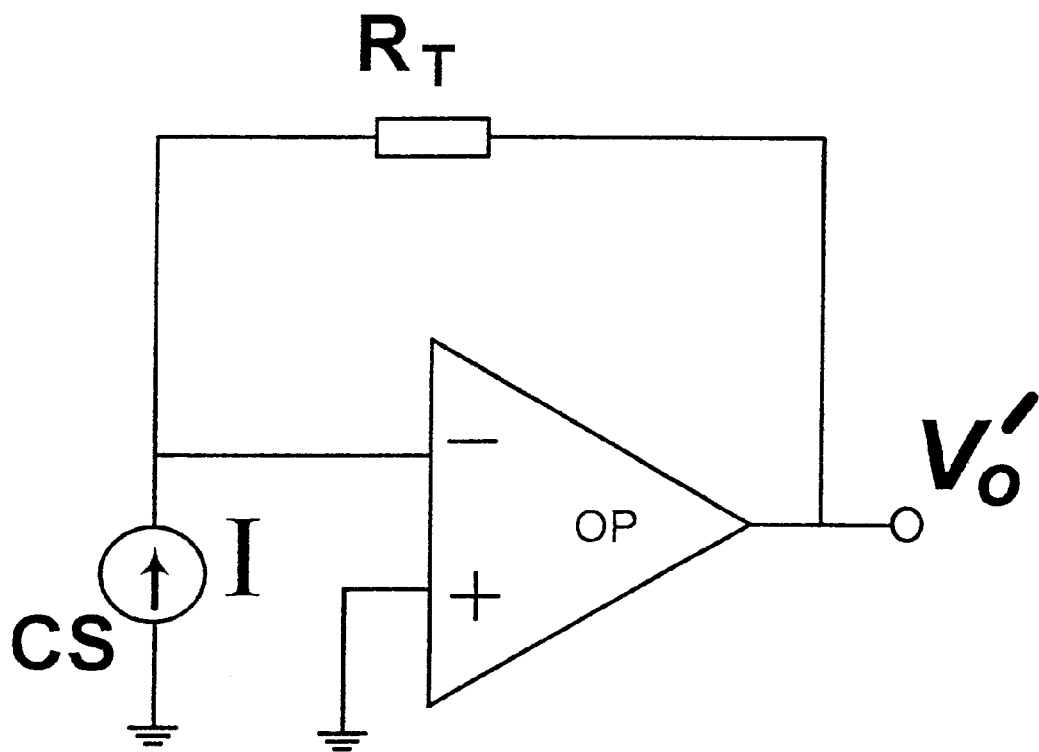
FIG. 1 is a conventional current-to-voltage converter.

A conventional current-to-voltage converter is shown in FIG. 1, which comprises an operational amplifier OP and a resistor $R_T$. The output voltage $V'_0$ of this converter is expressed as $$V'_0 = IR_T \quad (1)$$

where

I is the input current from a current-type sensing device CS to the conventional current-to-voltage converter, and $R_T$ is resistor.

Figure 2:
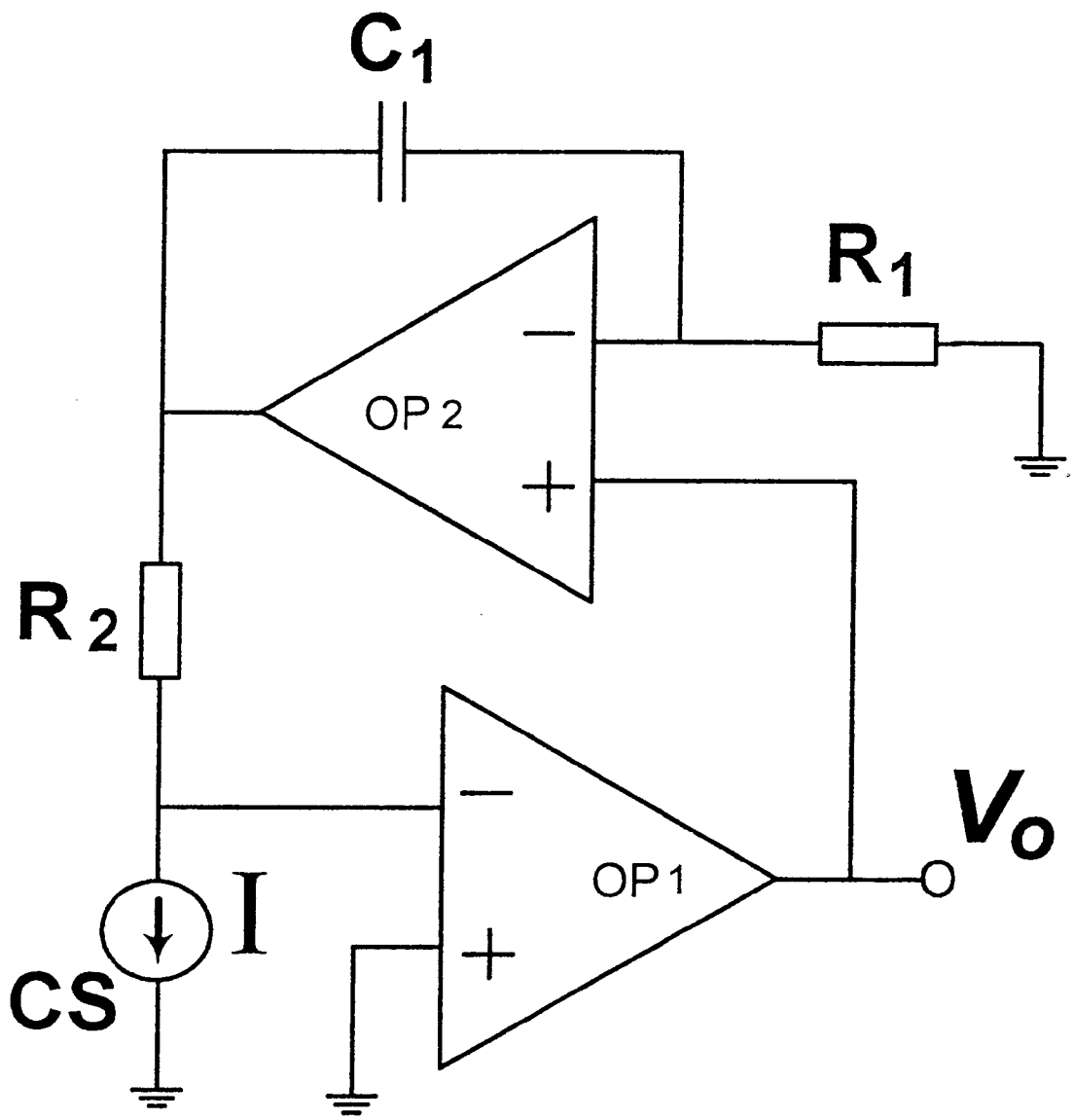
FIG. 2 shows a current-to-voltage converter with highpass filter function constructed according to one of the preferred embodiments of the present invention.

A current-to-voltage converter with highpass filter function is disclosed in the present invention, which comprises two operational amplifiers OP1 and OP2, two resistors $R_1$ and $R_2$, and a capacitor $C_1$ as shown in FIG. 2.

The noninverting (+) terminal of the operational amplifier OP1 is grounded. The inverting (−) terminal of the operational amplifier OP1 is used to receive an output of a current-type sensing device CS and connected to the output terminal of the operational amplifier OP2 via the resistor $R_2$. The output terminal of the operational amplifier OP1 is connected to the noninverting terminal of the operational amplifier OP2. The output of the operational amplifier OP2 is fed back to the inverting terminal of the operational amplifier OP2 via the capacitor $C_1$, and the inverting terminal of the operational amplifier OP2 is connected to one terminal of the resistor $R_1$ of which another terminal is grounded. The output voltage $V_0$ of the current-to-voltage converter with highpass filter function is provided at a node between the output terminal of the operational amplifier OP1 and the noninverting terminal of the operational amplifier OP2.

A. Transfer Function

The structure of the proposed current-to-voltage converter with highpass filter function illustrated in FIG. 2 has, after some manipulation, the following transfer function F(S):

$$F(S) = \frac{V_O}{I} = \frac{R_2 S}{S + \frac{1}{R_1 C_1}} \quad (2)$$

where $V_O$ is the output voltage of the current-to-voltage converter with highpass filter function I is the input current of the current-to-voltage converter with highpass filter function S is parameter of Laplace $R_1$ and $R_2$ are resistors; and $C_1$ is capacitor.

It is apparent that the proposed current-to-voltage converter has the function of highpass filter. From the equation (2), the −3 dB frequency $f_0$ and the conversion gain K of the filter are given by $$f_0 = \frac{1}{2\pi R_1 C_1} \quad (3)$$

$$K = R_2 \quad (4)$$

From equation (3) and (4), it is found that the −3 dB frequency $f_0$ and the conversion gain K are independent.

B. Results of Computer Simulation

The computer simulation of this invention, current-to-voltage converter with highpass filter function, with Pspice software was carried out and described as follows:

Given −3 dB frequency $f_0$=1000 Hz and capacitor $C_1$=10 nF, the resistor $R_1$ can be obtained according to the equation (3), which is $R_1$=15.9 KΩ. Assuming the input current I=1 μA and the resistor $R_2$=1 MΩ, the frequency response of the proposed current-to-voltage converter with highpass filter function depicted in FIG. 2 was obtained and shown in FIG. 3.

Figure 3:
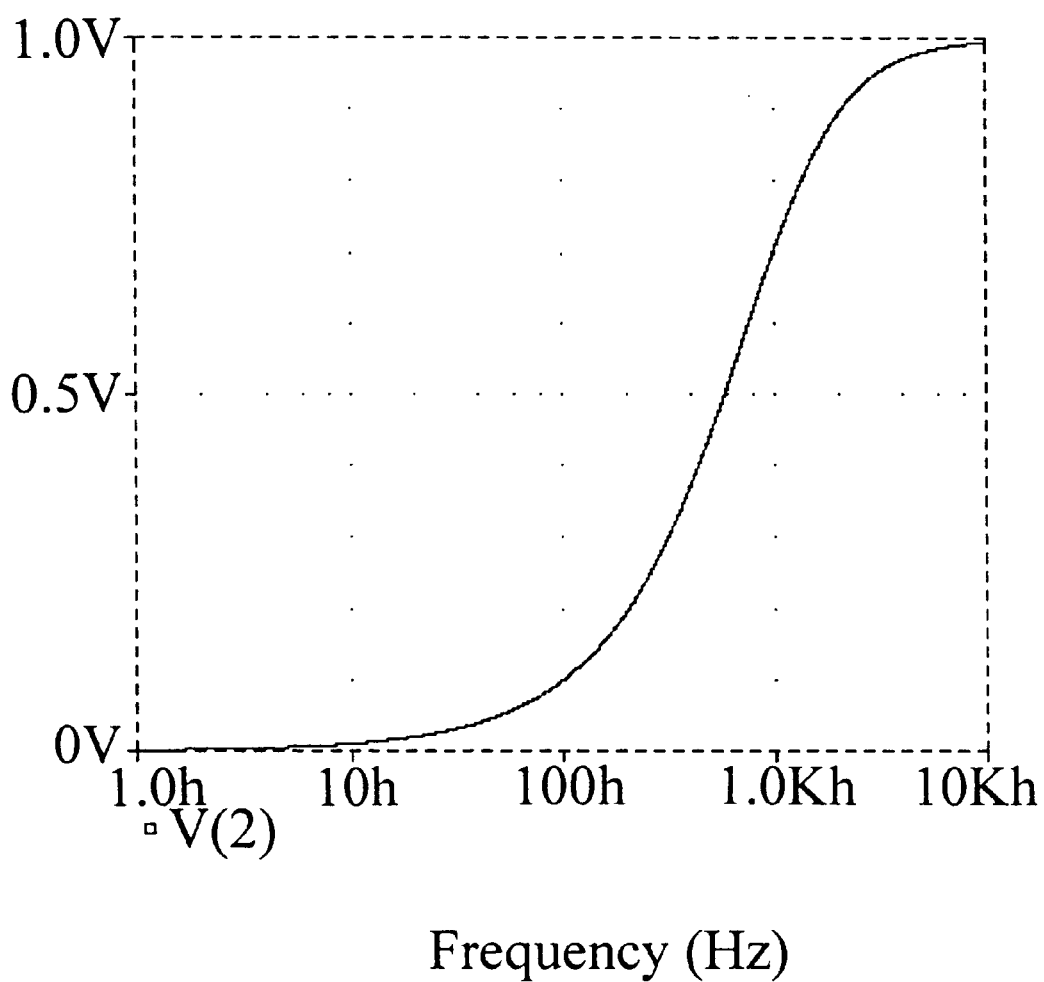
FIG. 3 is a frequency vs. volt plot which shows a simulation of frequency response of the current-to-voltage converter with highpass filter function shown in FIG. 2, wherein the −3 dB frequency $f_0=1000$ Hz.

The units of horizontal and vertical axes in FIG. 2 are Hertz (Hz) and volt respectively. The output voltage is less than 0.7 V if the frequency is less than 1000 Hz, and the output voltage decreases as the frequency decreases. When the frequency is higher than 10 Khz, the output voltage is 1 V nearly. It is apparent that FIG. 3 is a typical frequency response of a highpass filter.

C. Results of Practical Tests

To demonstrate the feasibility of the proposed current-to-voltage converter with highpass filter function shown in FIG. 2, the current-type sensing device CS was realized with a commercial photodetector OPT211 integrated with an operational amplifier OP1, the operational amplifier OP2 was realized with a commercial operational amplifier LF347 (National Semiconductor, U.S.), and the other passive component values were designed as $C_1$=10 nF, $R_1$=15.9 KΩ and $R_2$=3.3 MΩ. That is the −3 dB frequency $f_0$=1000 Hz and the conversion gain K=3.3 MΩ. The incident light came from a fluorescent lamp with flickering frequency of 120 Hz.

Figure 4:
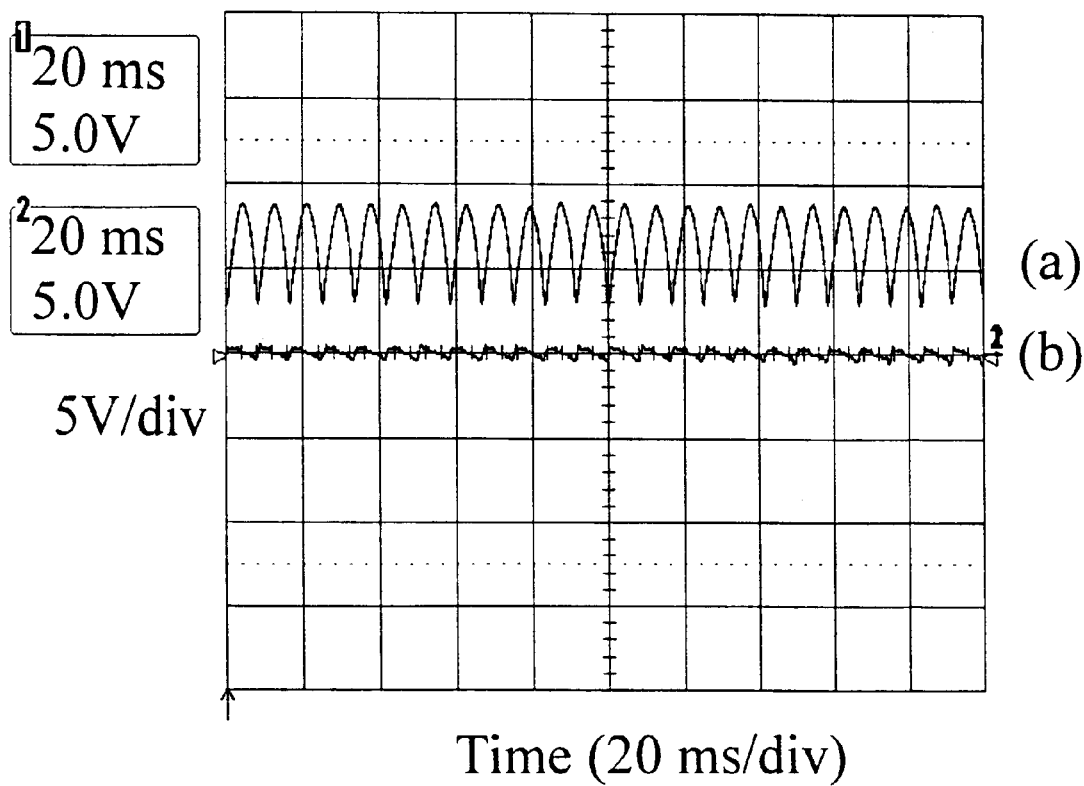
FIG. 4 shows test results of the current-to-voltage converter with highpass filter function depicted in FIG. 2 and of the conventional current-to-voltage converter depicted in FIG. 1, wherein the current-type sensing device is photodetector and the incident light comes from a fluorescent lamp with flickering frequency of 120 Hz, wherein signal (a) composed of a dc component and an ac component with a fundamental frequency at 120 Hz is the output of the simple current-to-voltage converter shown in FIG. 1, and signal (b) without the dc component and with the suppression of 120 Hz ac component is the output of the proposed current-to-voltage converter with highpass filter function shown in FIG. 2.

The test results of the current-to-voltage converter with highpass filter function depicted in FIG. 2 are shown in FIG. 4 in comparison with those of the conventional current-to-voltage converter depicted in FIG. 1, wherein signal (a) composed of a dc component and an ac component with a fundamental frequency at 120 Hz is the output of the conventional current-to-voltage converter shown in FIG. 1, wherein the current-type sensing device and the operational amplifier OP are the photodetector OPT211 and the resistor $R_T$=3.3 MΩ; and signal (b) without the dc component and with the suppression of 120 Hz ac component is the output of the proposed current-to-voltage converter with highpass filter function shown in FIG. 2. It is clear that the dc signal can be eliminated thoroughly and the unwanted low-frequency interference can be suppressed by the proposed invention, current-to-voltage converter with highpass filter function. The amplitude and time scales of both signal (a) and signal (b) are 5 V/div and 20 ms/div respectively.

The current-to-voltage converter with highpass filter function constructed in accordance with the present invention may be fabricated as a single chip IC or part of any other signal processing IC.

Having thus described the present invention, which is now deemed appropriate for Letters Patent is set out in the following appended claims.

What is claimed is:

1. A current-to-voltage converter with highpass filter function comprising two operational amplifiers OP1 and OP2, two resistors $R_1$ and $R_2$, and a capacitor $C_1$, wherein a noninverting (+) terminal of the operational amplifier OP1 is grounded, an inverting (−) terminal of the operational amplifier OP1 is used to receive an output of a current-type sensing device and is connected to an output terminal of the operational amplifier OP2 via the resistor $R_2$, and an output terminal of the operational amplifier OP1 is connected to a noninverting terminal of the operational amplifier OP2;

the output terminal of the operational amplifier OP2 is fed back to an inverting terminal of the operational amplifier OP2 via the capacitor $C_1$, and the inverting terminal of the operational amplifier OP2 is connected to one terminal of the resistor $R_1$ of which another terminal is grounded; and the output terminal of the operational amplifier OP1 is not fed back to the inverting terminal of the operational amplifier OP1.

* * * * *